United States Patent
Lin et al.

(10) Patent No.: US 7,525,182 B2
(45) Date of Patent: *Apr. 28, 2009

(54) MULTI-PACKAGE MODULE AND ELECTRONIC DEVICE USING THE SAME

(75) Inventors: Chih-Hsiung Lin, Taipei (TW); Nai-Shung Chang, Taipei (TW)

(73) Assignee: Via Technologies Inc., Taipei (TW)

( * ) Notice: Subject to any disclaimer, the term of this patent is extended or adjusted under 35 U.S.C. 154(b) by 448 days.

This patent is subject to a terminal disclaimer.

(21) Appl. No.: 11/243,121

(22) Filed: Oct. 4, 2005

(65) Prior Publication Data
US 2006/0284314 A1   Dec. 21, 2006

(30) Foreign Application Priority Data
Jun. 20, 2005   (TW) ............................... 94120410 A

(51) Int. Cl.
*H01L 23/495* (2006.01)
(52) U.S. Cl. .............................. 257/675; 257/E23.106; 257/706; 257/707; 257/737
(58) Field of Classification Search .......... 257/E23.088, 257/E23.102, E23.105, 737, 706, 707, 712, 257/714, 715, 721, 722, 777, E23.106, 675, 257/690, 796
See application file for complete search history.

(56) References Cited

U.S. PATENT DOCUMENTS

| | | | | | |
|---|---|---|---|---|---|
| 4,392,362 | A | * | 7/1983 | Little | 62/51.1 |
| 4,849,857 | A | * | 7/1989 | Butt et al. | 361/708 |
| 4,866,571 | A | * | 9/1989 | Butt | 361/717 |
| 5,005,282 | A | * | 4/1991 | Rose | 29/827 |
| 5,095,404 | A | * | 3/1992 | Chao | 361/700 |
| 5,340,771 | A | * | 8/1994 | Rostoker | 29/827 |
| 5,414,299 | A | * | 5/1995 | Wang et al. | 257/702 |
| 5,610,440 | A | * | 3/1997 | Isozaki | 257/713 |
| 6,265,771 | B1 | * | 7/2001 | Ference et al. | 257/706 |
| 6,462,421 | B1 | * | 10/2002 | Hsu et al. | 257/777 |
| 6,472,741 | B1 | * | 10/2002 | Chen et al. | 257/712 |
| 6,476,474 | B1 | * | 11/2002 | Hung | 257/686 |
| 6,492,739 | B2 | * | 12/2002 | Muto et al. | 257/787 |
| 6,504,720 | B2 | * | 1/2003 | Furuya | 361/699 |
| 6,580,159 | B1 | * | 6/2003 | Fusaro et al. | 257/668 |
| 6,657,296 | B2 | * | 12/2003 | Ho et al. | 257/720 |
| 6,700,783 | B1 | * | 3/2004 | Liu et al. | 361/704 |
| 7,298,028 | B2 | * | 11/2007 | Lin et al. | 257/675 |
| 2003/0189222 | A1 | * | 10/2003 | Itou et al. | 257/200 |

* cited by examiner

*Primary Examiner*—Chris C. Chu
(74) *Attorney, Agent, or Firm*—Thomas, Kayden, Horstemeyer & Risley

(57) ABSTRACT

A package substrate for a multi-package module. The package substrate comprises a substrate having a die region and at least one thermal channel region outwardly extending to an edge of the substrate from the die region. An array of bumps is arranged on the substrate except in the die and thermal channel regions, in which the interval between the bumps is narrower than the width of the thermal channel region. An electronic device with a package substrate is also disclosed.

8 Claims, 4 Drawing Sheets

MULTI-PACKAGE MODULE AND ELECTRONIC DEVICE USING THE SAME

BACKGROUND

The invention relates to an electronic package and in particular to a package substrate for multi-package module for thermal dissipation and an electronic device using the same.

Demand for small, high performance portable electronic products such as cell phones, mobile computers, and the like have driven the industry to increase integration on individual semiconductor dice. Accordingly, the industry is achieving high integration by turning to 3D packaging by combining assembly technologies including wire bonding or flip chip to stack die packages to form a multi-package module (MPM).

MPM, a current assembly technology, integrates different functions of dice, such as microprocessors or memory, logic, optic ICs, instead of placing individual packages onto a large printed circuit board (PCB). MPM, however, has a much higher power density than an individual single die package. Thus, thermal management is a key factor in its successful development.

FIG. 1 illustrates a conventional electronic device 100 with an MPM. The electronic device 100 comprises a MPM 20 mounted on a PCB 101 and comprising a package substrate 12. The upper and lower surfaces of the package substrate 12 have dice 16 and 14 with different functions thereon, respectively, to create the MPM 20. For example, the die 16 is mounted on the upper surface of the package substrate 12 by bumps (or solder balls) of a package substrate 12'. The die 14 is mounted on the lower surface of the package substrate 12 by flip chip. The lower surface of the package substrate 12 comprises a plurality of bumps 10 thereon to correspondingly connect to the bonding pads (not shown) on the PCB 101. In the MPM 20, heat generated from the die 16 can be dissipated by radiation and convection. The gap g between the die 14 and the PCB 101 is too narrow, however, to dissipate the heat generated from thereof by radiation and convection. Accordingly, the heat generated from the die 14 is dissipated by conduction only. Typically, a metal layer 102 is disposed on the PCB 101 corresponding to the die 14 and connected to the die 14 by a heat conductive paste 22. That is, thermal dissipation is accomplished by a thermal conductive path created by the heat conductive paste 22, the metal layer 102 and the PCB 101.

Passive cooling, however, cannot provide adequate thermal dissipation at a higher rate for high power dice which may generate higher heat. That is generated heat cannot be rapidly dissipated from dice by conducting the heat to the PCB through the heat conductive paste and the metal layer.

SUMMARY

A package substrate for multi-package module and an electronic device using the same are provided. An embodiment of a package substrate for a multi-package module comprises a substrate having a die region and at least one thermal channel region outwardly extending to an edge of the substrate from the die region. An array of bumps is arranged on the substrate except in the die and thermal channel regions, wherein the interval between the bumps is narrower than the width of the thermal channel region.

An exemplary embodiment of an electronic device comprises a package substrate, comprising a substrate having a die region and at least one thermal channel region outwardly extending to an edge of the substrate from the die region and an array of bumps arranged on the substrate except in the die and thermal channel regions. A circuit board comprises a plurality of bonding pads correspondingly connecting to the bumps. A heat sink is disposed between the circuit board and the package substrate, comprising a first portion corresponding to the die region and a second portion adjacent to the first portion, extending to the circuit board outside the package substrate along the thermal channel region.

An embodiment of an electronic device, additionally, comprises a package substrate, comprising a substrate having a die region and at least one thermal channel region outwardly extending to an edge of the substrate from the die region and an array of bumps arranged on the substrate except in the die and thermal channel regions. A circuit board comprises a plurality of bonding pads correspondingly connecting to the bumps and a metal layer underlying the package substrate. The metal layer comprises a first portion corresponding to the die region, a second portion adjacent to the first portion, extending to the circuit board outside the package substrate along the thermal channel region and a third portion adjacent to the end of the second portion.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

A package substrate for multi-package module (MPM) and an electronic device using the same will now be described in greater detail.

Figure 1:
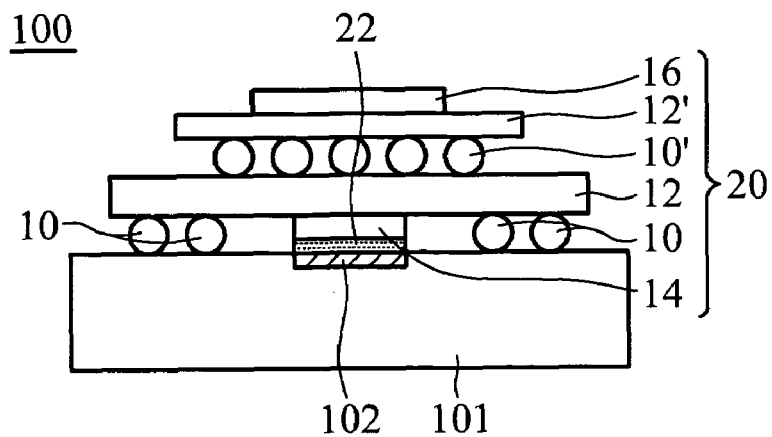
FIG. 1 is a cross-section of a conventional electronic device with a multi-package module.
Figure 2A:
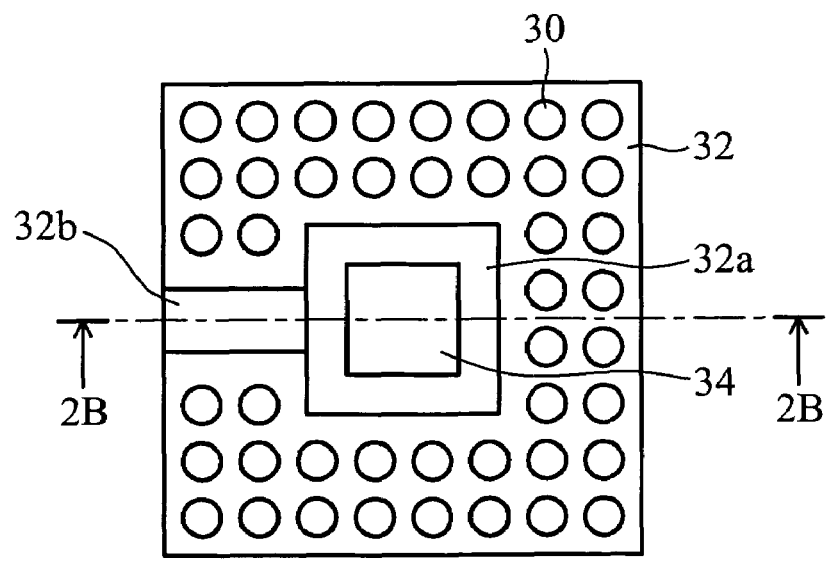
FIG. 2A is a bottom plane view of an embodiment of a multi-package module.
Figure 2B:
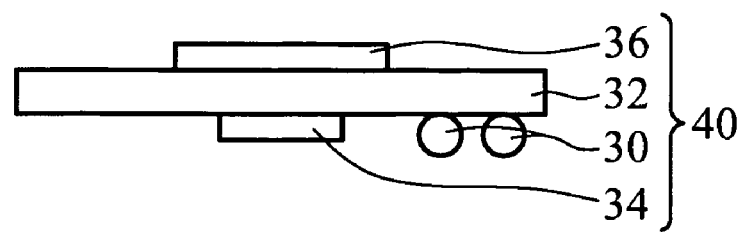
FIG. 2B is a cross-section along line 2B-2B of FIG. 2A.
Figure 2C:
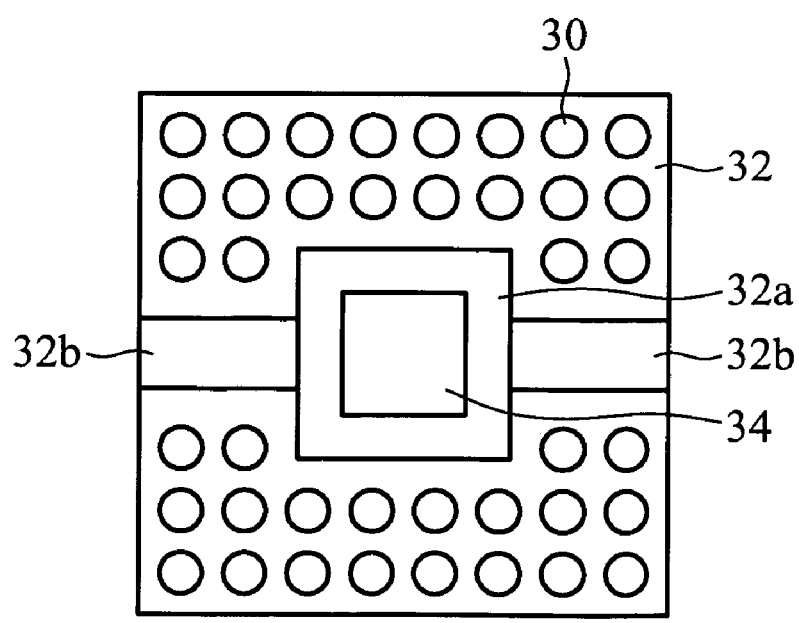
FIG. 2C is a bottom plane view of an embodiment of a multi-package module.

FIGS. 2A and 2B illustrate an exemplary embodiment of an MPM, wherein FIG. 2A is a bottom plane view of the MPM and FIG. 2B is a cross-section along line 2B-2B of FIG. 2A. The MPM 40 comprises a package substrate 32. The lower surface of the package substrate 32 has a die region 32a and at least one thermal channel region 32b and the upper surface of the package substrate 32 also has a die region (not shown). Here, the lower surface represents a surface facing the surface of a circuit board, such as a printed circuit board (PCB) and the upper surface represents the surface opposite to the lower surface. In this embodiment, the package substrate 32 may comprise plastic, ceramic, inorganic or organic material. Typically, the die region 32a is substantially at the center of the package substrate 32. Unlike the conventional package substrate, the package substrate 32 comprises at least one thermal channel region 32b outwardly extending to an edge of the package substrate 32 from the die region 32a. In some embodiments, the thermal channel region 32b may extend to an opposite edge of the package substrate 32 across the die region 32a, as shown in FIG. 2C. It will be apparent to those skilled in the art that the package substrate 32 may comprise one or more thermal channel regions extending to the edges of the package substrate 32 along different directions from the die region 32a and it is to be understood that the invention is not limited to FIGS. 2A and 2C.

Dice 34 and 36 with different functions may be respectively mounted in the die region 32a of the lower surface and that of the upper surface of the package substrate 32 by the same or different electronic packages. For example, dice 34 and 36 may respectively be mounted on the package substrate 32 by flip chip or wire bonding.

An array of bumps 30, such as metal bump, solder balls, signal balls or the like, is arranged on the lower surface of the package substrate 32 except in the die region 32a and the thermal channel region 32b, to transport signals to external circuits from the dice 34 and 36. The interval between the bumps 30 is narrower than the width of the thermal channel region 32b.

Figure 3A:
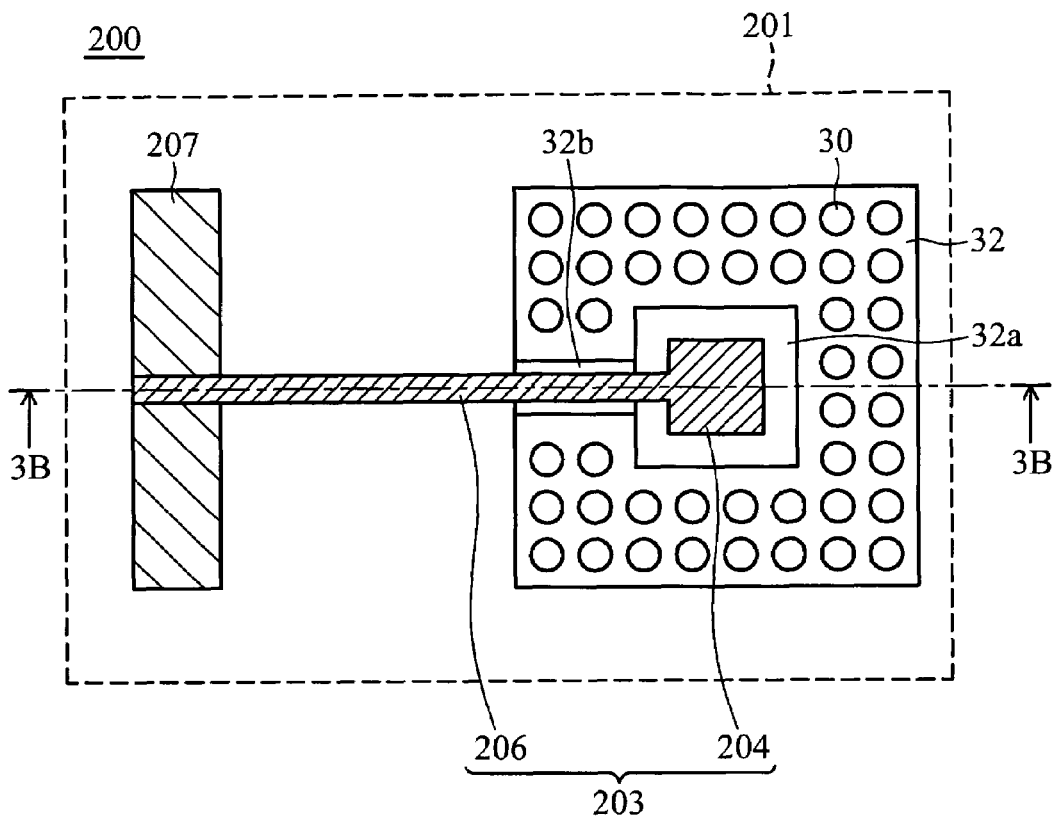
FIG. 3A is a bottom plane view of an embodiment of electronic device with a multi-package module of the invention.
Figure 3B:
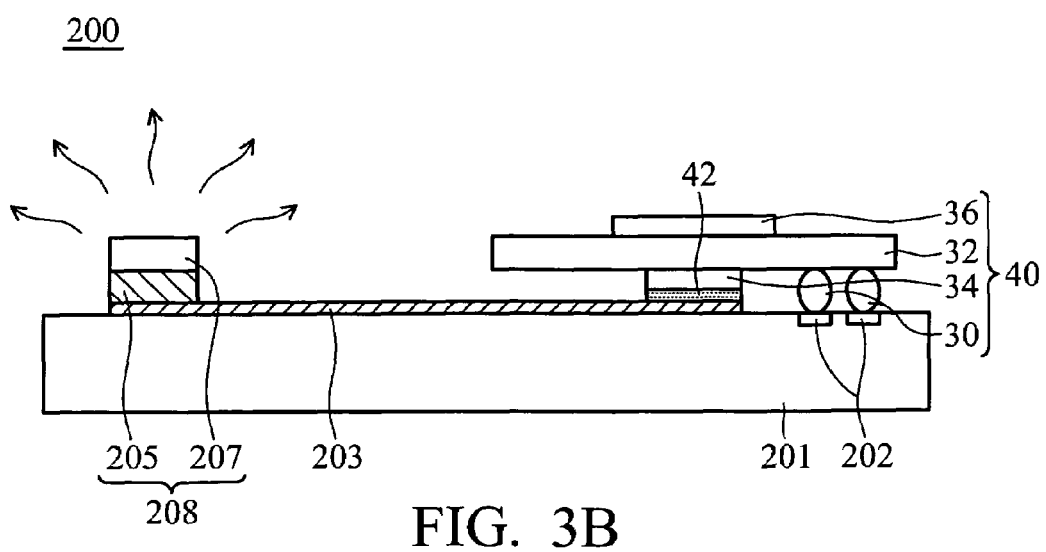
FIG. 3B is a cross-section along line 3B-3B of FIG. 3A.

FIGS. 3A and 3B illustrate an embodiment of an electronic device with an MPM of the invention, wherein FIG. 3A is a bottom plane view of the electronic device and FIG. 3B is a cross-section along line 3B-3B of FIG. 3A, and the same reference numbers as FIGS. 2A and 2B are used, wherefrom like descriptions are omitted. The electronic device 200 comprises MPM 40, a circuit board 201 and a heat sink 203. As mentioned, the MPM 40 comprises a package substrate 32 and dice 34 and 36. The package substrate 32 comprises an array of bumps 30 arranged on the lower surface of the package substrate 32 except in the die region 32 an and the thermal channel region 32b. Dice 34 and 36 are respectively disposed on the die region 32a of the lower surface and that of the upper surface of the package substrate 32.

A circuit board 201, such as a PCB, comprises a plurality of bonding pads 202 correspondingly connected to the bumps 30, thereby electronically connecting the circuit board 201 and the dice 34 and 36. Typically, the circuit board 201 comprises at least one or more metal layers and at least one or more insulating layers, in which the metal layer may serve as a signal layer, a power layer, and/or a grounding layer. In order to simplify the diagram, a flat substrate is depicted.

A heat sink 203 is disposed on the circuit board 201 and between the circuit board 201 and the package substrate 32, comprising first and second portions 204 and 206. The first portion 204 corresponds to the die region 32a and connected to the die 34 by a heat conductive paste 42. The second portion 206 is adjacent to the first portion 204 and extends outside the package substrate 32 along the thermal channel region 32b. In this embodiment, the heat sink 203 comprises gold, silver or copper. Moreover, the first portion 204 of the heat sink 203 may partially or fully overlap the die 34. Here, only an example of the full overlap is depicted. Note that the shape of the heat sink 203 may be varied with the design of the thermal channel region 32b.

A thermal dissipation module 208 is disposed on the second portion 206 of the heat sink 203 outside the package substrate 32, providing an active thermal dissipation. In this embodiment, the thermal dissipation module 208 may comprise a fan 207 and an underlying heat dissipating component 205, such as a heat plate or pipe.

According to the electronic device 200 of the invention, the thermal channel region 32b can be formed by rearranging the bumps 30. Moreover, since the heat sink 203 may extend outside the package substrate 32 along the thermal channel region 32b, the heat generated from the die 34 on the lower surface of the package substrate 32 can be effectively and rapidly dissipated, to the ambient environment by radiation, convection and conduction, as shown by the arrows in FIG. 3B. Additionally, if the die 34 is a high power die, the heat can be dissipated quickly by the fan 207. Compared to conventional thermal dissipation by conduction of the circuit board, the electronic device 200 with MPM 40 of this embodiment has better thermal dissipation and a higher thermal dissipation rate.

Figure 4A:
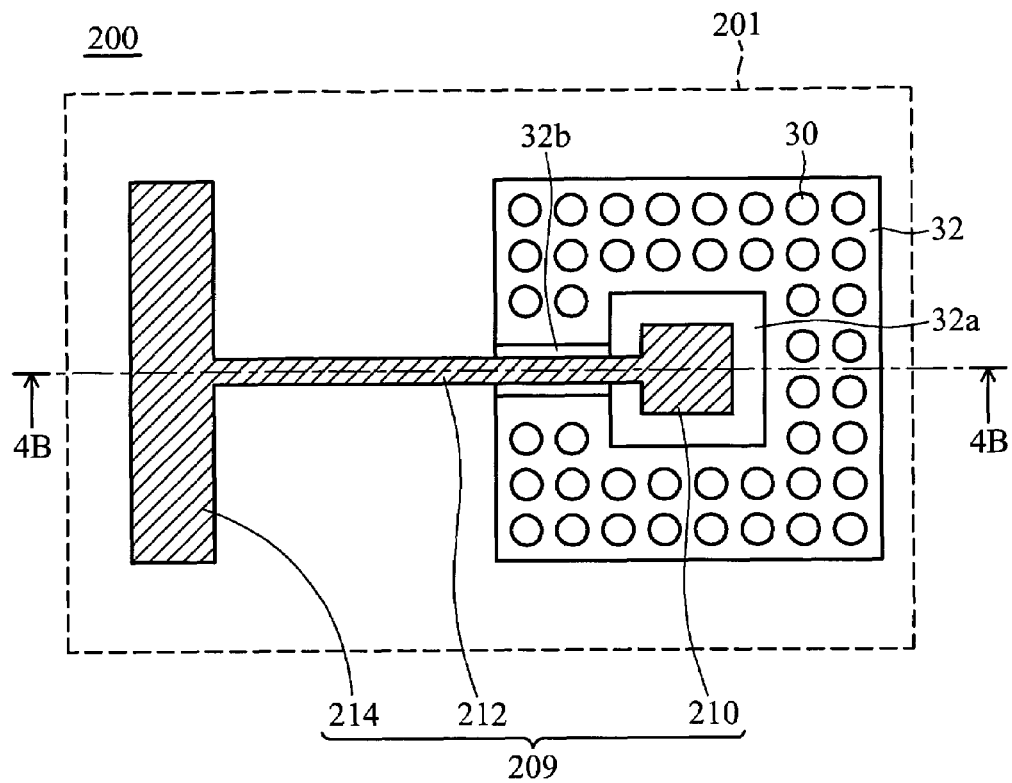
FIG. 4A is a bottom plane view of an embodiment of electronic device with a multi-package module.
Figure 4B:
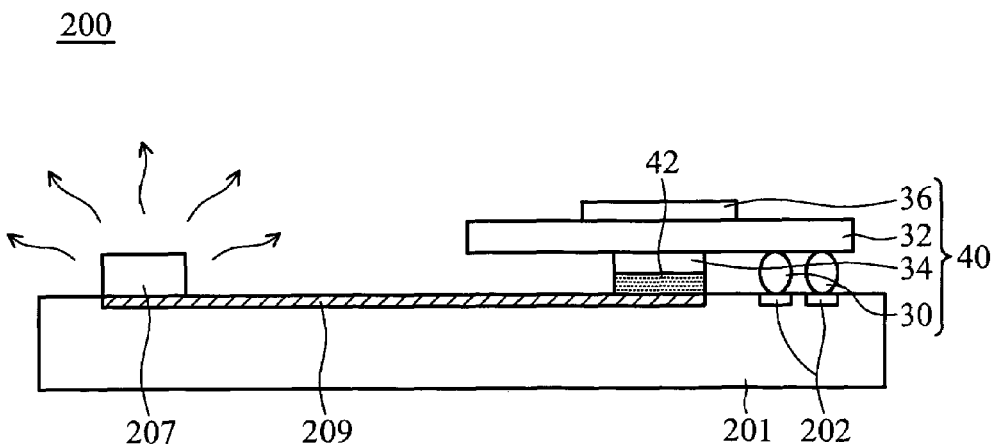
FIG. 4B is a cross-section along line 4B-4B of FIG. 4A.

FIGS. 4A and 4B illustrate an embodiment of an electronic device with an MPM, wherein FIG. 4A is a bottom plane view of the electronic device and FIG. 4B is a cross-section along line 4B-4B of FIG. 3A. The same reference numbers as FIGS. 3A and 3B are used, wherefrom like descriptions are omitted. Unlike the embodiment of FIGS. 3A and 3B, the thermal conductive path is formed by defining a metal layer 209 of the circuit board 201. In this embodiment, the metal layer 209 comprises a first portion 210, a second portion 212 and a third portion 214. The first portion 210 of the metal layer 209 corresponds to the die region 32a and is connected to the die 34 by a heat conductive paste 42. The second portion 212 of the metal layer 209 is adjacent to the first portion 210 and extends outside the package substrate 32 along the thermal channel region 32b. The third portion 214 of the metal layer 209 is adjacent to the end of the second portion 212. The first and second portions 210 and 212 of the metal layer 209 serve as a heat sink to conduct heat generated from the die 34 outside the package substrate 32. The third portion 214 of the metal layer 209 serves as a heat dissipating component to dissipate heat to the ambient environment by a fan 207 disposed thereon, as shown by the arrows in FIG. 4B.

In this embodiment, since the metal layer 209 may extend outside the package substrate 32 along the thermal channel region 32b, the heat generated from the die 34 on the lower surface of the package substrate 32 can be effectively and rapidly dissipated to the ambient environment by radiation, convection and conduction. Compared to the conventional thermal dissipation by conduction of the circuit board, the electronic device 200 with MPM 40 has better thermal dissipation and a higher thermal dissipation rate. Moreover, since the metal layer 209 is included in the circuit board 201, no additional heat sink and heat dissipating component are required.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
a package substrate, comprising:
  a substrate having a die region and at least one thermal channel region outwardly extending to an edge of the substrate from the die region; and
  an array of bumps arranged on the substrate except in the die and thermal channel regions;
a circuit board comprising a plurality of bonding pads correspondingly connected to the bumps; and
a heat sink disposed between the circuit board and the package substrate, comprising:
  a first portion corresponding to the die region; and
  a second portion adjacent to the first portion, extending to the circuit board outside the package substrate along the thermal channel region.

2. The electronic device as claimed in claim 1, further comprising a thermal dissipation module disposed on the second portion of the heat sink outside the package substrate.

3. The electronic device as claimed in claim 2, wherein the thermal dissipation module comprises a fan and a heat plate or pipe.

4. The electronic device as claimed in claim 1, wherein the heat sink comprises gold, silver or copper.

5. The electronic device as claimed in claim 1, further comprising a first die disposed in the die region and connected to the first portion of the heat sink.

6. The electronic device as claimed in claim 5, wherein the first portion of the heat sink partially or completely overlaps the first die.

7. The electronic device as claimed in claim 5, further comprising a second die disposed on the substrate opposite to the first die.

8. The electronic device as claimed in claim 5, wherein the heat sink is connected to the first die by a heat conductive paste.

* * * * *